(12) United States Patent
Chernobrod et al.

(10) Patent No.: US 6,687,149 B2
(45) Date of Patent: Feb. 3, 2004

(54) VOLUMETRIC ELECTRO-OPTICAL RECORDING

(75) Inventors: Boris Chernobrod, Redwood City, CA (US); Jacob Malkin, Boulder, CA (US); Vladimir Schwartz, Lexington, MA (US)

(73) Assignee: OptaByte, Inc., Lexington, MA (US)

(*) Notice: Subject to any disclaimer, the term of this patent is extended or adjusted under 35 U.S.C. 154(b) by 0 days.

(21) Appl. No.: 09/810,432

(22) Filed: Mar. 19, 2001

(65) Prior Publication Data

US 2002/0141221 A1 Oct. 3, 2002

Related U.S. Application Data

(60) Provisional application No. 60/265,881, filed on Feb. 5, 2001.

(51) Int. Cl.[7] .............................................. G11C 13/04
(52) U.S. Cl. ....................... 365/110; 365/111; 365/175
(58) Field of Search ................................ 365/110, 111, 365/175, 189.09, 215

(56) References Cited

U.S. PATENT DOCUMENTS

| | | | |
|---|---|---|---|
| 3,543,248 A | 11/1970 | Oliver | |
| 3,623,026 A | 11/1972 | Engeler et al. | 340/173 |
| 4,392,209 A | * 7/1983 | DeBar | 365/110 |
| 5,504,323 A | 4/1996 | Heeger et al. | 250/214.1 |
| 5,886,972 A | 3/1999 | Jiang et al. | |
| 5,926,411 A | 7/1999 | Russell | |
| 6,147,901 A | 11/2000 | Sakata et al. | 365/175 |

FOREIGN PATENT DOCUMENTS

| | | |
|---|---|---|
| JP | 04 206568 A | 7/1992 |
| JP | 06 313971 A | 11/1999 |
| JP | 2000 208724 A | 7/2000 |
| WO | WO 97/48009 | 12/1997 |
| WO | WO 98 55897 A | 12/1998 |
| WO | WO 98 58383 A | 12/1998 |
| WO | WO 00 48175 A | 8/2000 |

* cited by examiner

Primary Examiner—David Lam
(74) Attorney, Agent, or Firm—Dorsey & Whitney LLP

(57) ABSTRACT

In an optical memory device, an electroluminescent matrix has a plurality of individually electrically addressable electroluminescent cells, each having a stack of memory cells. The electroluminescent cells are addressable by applying a biased voltage through a grid of light-transparent electrodes.

51 Claims, 11 Drawing Sheets

VOLUMETRIC ELECTRO-OPTICAL RECORDING

REFERENCE TO RELATED APPLICATION

The present application claims the benefit of U.S. Provisional Application No. 60/265,881, filed Feb. 5, 2001, whose disclosure is hereby incorporated by reference in its entirety into the present disclosure.

FIELD OF THE INVENTION

This present invention deals with the semiconductor type of memory devices capable of writing and reading information optically and having a multi-layer structure with multiple information layers as well as writing and reading arrangements for writing to and reading from such devices.

BACKGROUND OF THE INVENTION

Rapid progress has been made in data communication via the Internet by using mobile digital devices that combine the functionality of a PC. Such progress necessitates the development of non-volatile miniaturized semiconductor memory devices, known as solid state memory. However, the current capacity of the solid state memory devices does not meet the demand of the multi-gigabyte capacity needed for various computing applications. It also should be noted that these devices are expensive to make. One type of such devices, namely, DRAM, is progressing remarkably and is entering an era of gigabit storage capacity. DRAM increases its integration density by migrating from the initial structure that includes a plurality of transistors in one cell to a structure that consists of one transistor per cell. In the gigabit memory era, however, a capacitance of the storage capacitor is not sufficient for additional capability increases even by adapting trenched and stacked structures. Various technology adaptations utilize high dielectric constant materials as insulating layers in capacitors, and yet many problems are unresolved even till now. The conventional DRAMs with the trenched or stacked structures, as well as DRAMs that employ high dielectric constant materials for storage capacitors, require complicated fabrication processes and expensive manufacturing equipment. A cost of some ten billion dollars is estimated to be necessary to realize a manufacturing line which can mass manufacture semiconductor memory devices with an improved integration density. Moreover, since the conventional DRAMs are designed essentially on the basis of a planar (two-dimensional) layout, they can not be further miniaturized by the means of lithography. Thus, a technical barrier appears in the conventional solid sate semiconductor memory technologies, and a breakthrough in the technical barrier is necessitated.

A possible solution of these problems relates to an approach that combines optical signal processing technology and microelectronics. Originally this approach has been proposed for the utilization in the optical computers. A main advantage of the optical processing is that an individual element of the system can communicate simultaneously with an enormous number of other elements. This advantage originates from the fundamental nature of optical beams that do not interact with each other even in the case of crossing of their light path. One of the early inventions has been disclosed in U.S. Pat. No. 3,623,026 (1971), where a semiconductor device utilized for optical storing and reading of information has been proposed. This method utilizes a conductor-insulator-semiconductor structure (CIS) that serves as a capacitor for data storage. A thin layer of insulating material separates the conductor from the semiconductor. When the CIS structure is charged to the predetermined voltage and exposed to the radiation of band gap energies passing through the substantially transparent conductor and insulator layers, minority carriers are generated in the semiconductor bulk near or in the depletion region and move to the insulator-semiconductor interface. Reversing the voltage changes the direction of the electric field, thereby injecting minority carriers into the semiconductor and causing an emission of electromagnetic radiation. New approaches for an efficient and low cost technology are disclosed in U.S. Pat. No. 5,504,323, in which the device combines functions of the light emitting diode and photoreceiver. In this case, a positively biased diode functions as a light emitter. When a negative bias is applied, it becomes a highly efficient photo-diode. The described devices are an example of volatile memory, which needs continuous power supplying. A non-volatile optical semiconductor memory device was proposed recently U.S. Pat. No. 6,147,901 (2000). In this case, a memory cell utilizes vertically stacked structures comprised of p-i-n-i-p or n-i-p-i-n structures, where p means p-type semiconductor, n is n-type semiconductor and i is the intrinsic type of semiconductor. The electron-hole pairs are generated under the light illumination in the p/n-junction zone and under the biased voltage, electrons tunnel in the i-type semiconductor and are trapped there by the impurities. Such a structure is known as an electrical write-erase non-volatile memory.

The references mentioned above disclose types of memory cells and do not suggest any write/read device. PCT International Application No. WO 97/48009 A1 (1997) suggests an optical logic element that comprises a light source, a memory sub-layer, and a photo-sensor sub-layer. A plurality of these elements are assembled in memory or logic layers that could be integrated into a 3D multi-layer device. As a material for the memory device, the reference suggests a wide variety of materials which change their optical properties when exposed to the illuminating light source. These materials could be liquid crystals, photo-chromes or photo-chemicals. However, a possible realization of this idea is rather problematic due to the limited sensitivity of the photosensitive sub-layer. For example, the most advanced modem CCD matrix has a total charge capacity per pixel of about $10^5$ electrons in a size of 10 $\mu$. In the pixel of the proposed device having the size of 0.5 $\mu$, this value will be reduced to 250 electrons, which means that the working average value of the charge is about 100 electrons. During the reading, this amount of electrons corresponds to the shot noise of 10%, which is unacceptable for most of the applications.

The above described technical barriers exist today in the miniature high capacity semiconductor memory devices that are capable of storing and reading information with a high data rate due to the processes of the absorption and emission of light

SUMMARY OF THE INVENTION

The present invention resolves the above described limitations and has a way to provide a new type of solid state semiconductor memory devices which can retain stored content for a certain time period even after removal of the power supply. This is achieved by employing methods of light absorption and emission.

Another object of the present invention is to provide a semiconductor memory device capable of writing data optically and erasing data electrically and/or optically with a high rate of speed at the same time preserving the stored content even after removal of the power supply.

A further object of the present invention is to provide a semiconductor memory device capable of reading data optically at a high rate of speed.

A further object of the present invention is to provide a semiconductor memory device capable of being manufactured with the relatively easy fabrication processes and at lower costs.

A further object of the present invention is to provide a semiconductor memory device having a simple structure capable of being miniaturized with a relative ease.

A further object of the present invention is to provide a combination of the different types of semiconductor memory devices such as DRAM, SDRAM, and PROM combined with the functions of a typical CPU such as arithmetic and logic units. All of the functions in such types of devices could be combined in a single chip.

To achieve the required objectives, a first feature of the present invention lies in the arrangement of a sub-layer comprised of a two-dimensional array of electroluminescent cells organized into rows and columns, which are individually electrically addressable through the system of transparent electrodes disposed in rows and columns. The electroluminescent cells are located between the crossings of the electrodes. The electroluminescent materials could be organic or non-organic semiconductors. Each electroluminescent cell is stacked with a vertical multi-layer structure of memory cell matrices in which biased voltage can be applied through the crossing system of optically transparent electrodes to all memory cells in each layer. It should be noted that the memory cells are not individually electrically addressable; thus, each memory cell layer does not need such electronic circuits like parallel shift registers and thus it has a very simple structure. Each memory cell uses a CIS structure, which is a modification of the memory cell used in the electrically write/erase non-volatile semiconductor memory devices such as flash memory. Usually, the CIS structure is utilized as a capacitor to store information in the form of a charge. Such devices can be separated into a broad range defined by the charge storage mechanism. The first class contains devices where charges are stored in the deep energy states at or near the interface between the two gate dielectrics. In the devices of this class, the conducting mechanism utilized to transfer charges to the storage sites from the substrate is known as "tunneling." Tunneling is also utilized to remove charges from the storage sites to their original positions by the application of a control voltage pulse of the polarity opposite to that utilized in transferring and storage of the initial charges. The tunneling flux depends on the concentration of the minority carriers. The illumination of the semiconductor bulk by light having a frequency greater than the semiconductor band gap generates electron hole pairs in the controllable way. The number of the minority carriers generated is proportional to the amount of integrated radiation flux. When the reversed biased voltage is applied, trapped minority carriers tunnel back to the bulk semiconductor where they recombine with the minority carriers of the opposite type; that recombination is accompanied by a light emission. The other class of these memory devices could contain structures in which the charge is trapped in floating electrodes buried into dielectric. The best known device of this class is the FAMOS type (floating gate-avalanche injection MOS). In a FAMOS device, charges are transferred from a substrate to the floating gate by the avalanche breakdown that occurs under the high voltage applied between the source and drain. High-energy electrons are generated in the depletion regions of the reversed biased p/n junctions and pass through the gate dielectric material reaching floating gate under the influence of a strong electric field of the p/n junction. The floating gate could be a silicon-nitride thin layer that prevents conducting of electrons, yet it allows for a "hole" conductance. The conducting gate-electrodes are isolated by the insulator layers, which are made of silicon nitride. The "hot" electrons are trapped in the silicon nitride layer. In the modified electro-optical variant of the FAMOS device, the avalanche breakdown is initiated by the illuminating light, which generates the "electron-hole" pairs. The accumulation of the minority carriers in the p/n junction zone under the reverse biased voltage leads to a breakdown of the junction and trapping of the charges in the buried gate. To read the information written in the memory cell a relatively large positive voltage is applied to the gate contacts. The "holes" from the gate contact are injected into the nitride and attract negatively trapped charges. Recombination of the holes and trapped electrons results in the light emission. After this, the restoring voltage pulse recharges the cell. Other materials exhibiting such characteristics may also be suitable as well. It could be for example an organic polymer semiconductor. As it is mentioned above, the memory cell could exploit the organic polymer heterostructure, which serves as a photo-receiver and light emitter simultaneously. In another variant, the memory layers could be of constructed of electrochromic materials which change their transparency under the biased voltage. In the case of the nonvolatile memory, the transparency pattern exists when the biased voltage is turned off. Erasing of information from the layers is obtained by the application of the higher biased voltage. In the case of a WORM device, the changes in the transparency are made irreversibly. In the ROM device, the information is recorded in the form of pits filled by electrochromic material. The electrochromic medium works in the following way. When the biased voltage is turned off, all of the memory layers are totally transparent. The spatial modulation of the transparency occurs when the biased voltage is turned on. The system of crossing electrodes forms the pattern of transparency, which serves as a mask for the illuminating light. The broad variety of the design of the chargeable cells could be applied as well. For example, the memory cell could consist of two parts one of which is chargeable and the other is electroluminescent. During the reading process, the electroluminescent sub-cell may emit light. This depends on whether or not the chargeable sub-cell is charged up. Note that the sub-cells could be located in the same plane or they could be vertically stacked. In another embodiment, the optically transparent electroluminescent matrix could be located in the middle of the multi-layer stack. In this case, the electroluminescent matrix would emit light to the upper and lower semi-spheres simultaneously. The process of reading could be realized by the photosensitive matrix at the lower or upper boundary of the stack or by two photosensitive matrixes located at the upper and lower boundaries of the stack. A particular advantage of the optical writing and reading layers in the compatibility with vertical configuration of memory cell, when the charge coupling occurs between vertically disposed potential wells. This design reduces the size of the individual cell and leads to a simpler type of circuits. The smaller the size of the circuit, the more economical it is to manufacture a memory device.

The plurality of the compounds consisting of the electroluminescent matrix and stack of chargeable layers are isolated by the transparent insulating layers and stacked with the photo-sensitive matrix which could be CCD or CMOS device. The individual pixel of the photosensitive matrix has a size typical for a standard device of about 5–10 $\mu$. One advantage of various embodiments of the present invention is a lensless collection of the emitted light. Because of it, the cross talk between the emitting cells could be very significant. However, the demands for the contrast of the information image originated from the SNR are rather liberal, as it will be shown below that the contrast of about 8% can be sufficient. In order to avoid the undesirable cross talk between the simultaneously activated emitting memory cells, the distance between them must be more than the size of the photosensitive pixel. Evidently, the cross talk between the neighbor emitting memory cells depends on the distance between the photo-sensor surface and a certain sub-layer of the memory cell. The larger the distance—the more cross talk. Thus, the thickness of the memory stack can not be too large. This is one of the main factors limiting the capacity of this memory device. The optimal total thickness of the multi-layer memory structure must be comparable with the distance between the activated cells. This means that in the different memory layers the distance between the simultaneously activated emitting cells is different. The readout process could be realized from different layers simultaneously. The cross talk is avoided by the proper choice of the readout zone. This way the data reading could have a content protection feature which consists of a code recorded in a specific layer which gates data outflow from the device. To avoid the undesirable cross talk between the neighbor electroluminescent cells during recording, the distance between the cells as well as the distance between the activated memory cells should be sufficiently large. It should be noted as well that in this case the electroluminescent cells could be significantly larger in size than the memory cells

BRIEF DESCRIPTION OF THE DRAWINGS

Various preferred embodiments of the invention will be further described with reference being made to the drawings in which.

DETAILED DESCRIPTION OF THE PREFERRED EMBODIMENTS

Figure 1:
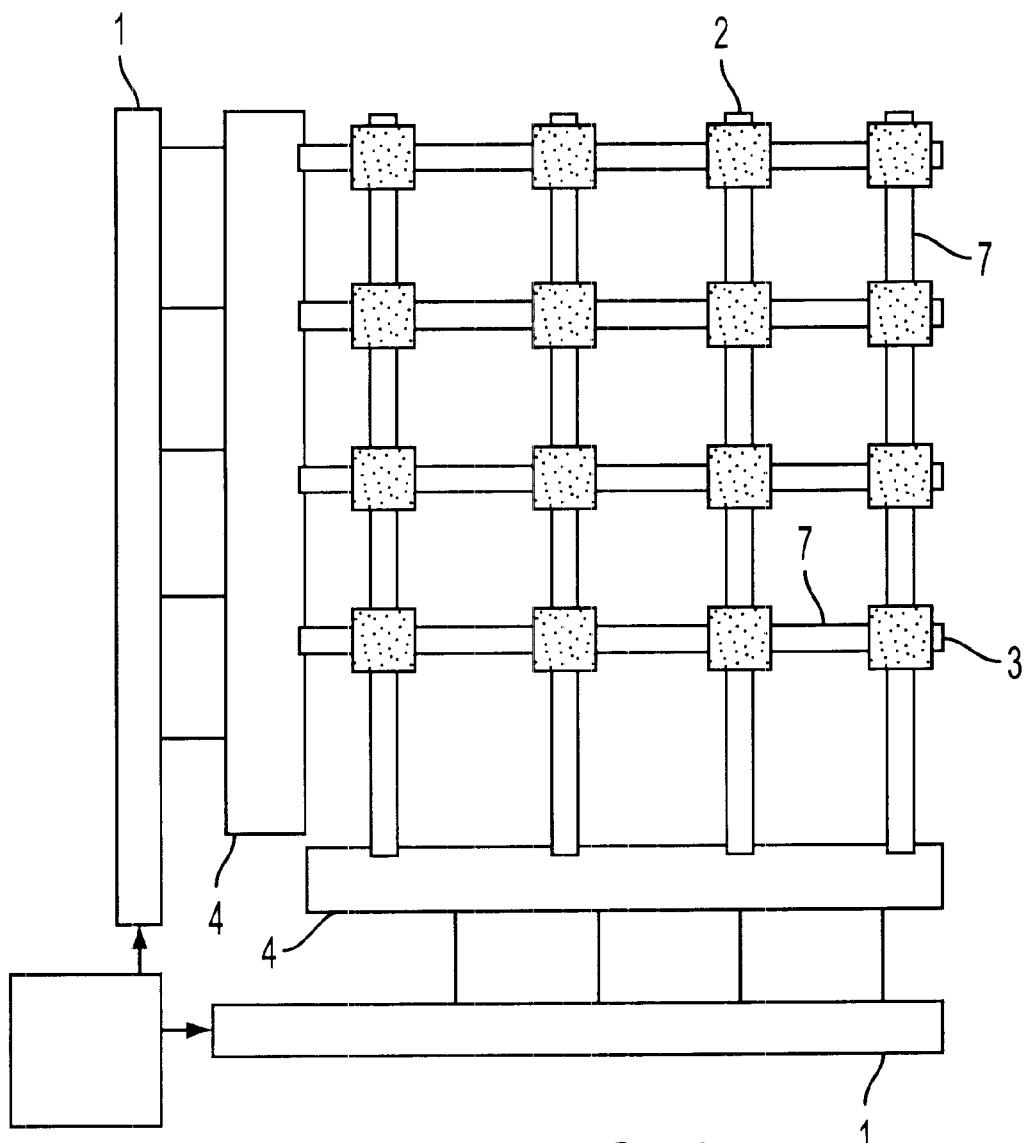
FIG. 1 is a schematic circuit diagram illustrating a matrix array of electroluminescent cells forming an activating matrix of storage device according to a preferred embodiment.

Various preferred embodiments of the present invention will be set forth in detail with reference to the drawings, in which like reference numerals refer to like components throughout.

FIG. 1 illustrates the general principles of the preferred embodiment. The memory device shown in FIG. 1 is formed on a single integrated circuit chip. In the process of recording, the information is delivered through the serial shift registers 1 and is clocked to the rows 2 and columns 3 of the parallel buffer registers 4. The parallel buffer registers are positioned perpendicular to the corresponding electrode row or column and provide parallel transfer of information into the electroluminescent cells.

Figure 2:
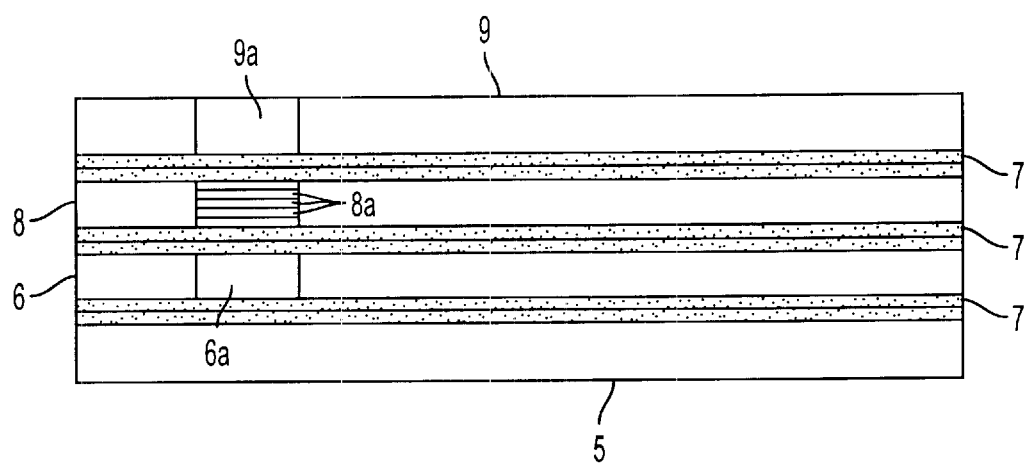
FIG. 2 is a cross-sectional view showing one example of a memory device in accordance with the preferred embodiment of FIG. 1.

FIG. 2 illustrates the monolithic design of the memory device. The electroluminescent matrix 6 is deposited onto the dielectric substrate 5. The electroluminescent cells 6a making up the matrix 6 are activated by the optically transparent crossings of electrodes 7. The multi-layer structure of the memory cell matrices 8 is stacked with the electroluminescent matrix 6 such that each electroluminescent cell 6a has multiple memory cells 8a stacked on it. The biased voltage is applied to the memory cells through the system of the optically transparent crossing electrodes 7. The multi-layer structure is stacked with the photosensitive matrix 9, which could be CCD matrix or CMOS matrix or other photosensitive matrix with the same functions, and which has a pixel 9a corresponding to each electroluminescent cell 6a and stack of memory cells 8a.

The memory device operates in the following way. The writing process starts with the activating of the addressable electroluminescent cells 6 by an electrical pulse. The memory cell from a certain layer of the multi-layer structure 8 receives the information in the form of light pulse and is under biased voltage, so that it stores the information in the form of coupled charges. The amount of the charges corresponding to the certain gray levels are provided by the time duration controlled electrical pulse applied to the electroluminescent cell.

The process of reading is realized by an application of the reverse voltage to a certain number of rows and columns, and is applied to the charged memory cells. This produces the recombination of the electron-hole pairs following by the emission of light. The image of the emitting memory cells is captured by the photosensitive matrix; the information is read out and decoded. The recharging pulse restoring information follows right after the reading pulse. If the recharging pulse doesn't follow the readout pulse, the information is erased.

To combine the miniature form-factor and significant capacity, the present embodiment uses optical processes without conventional optical elements. As the result, crosstalk between simultaneously emitting memory cells is the only limitation for the capacity. The SNR requirement gives the estimation of the acceptable contrast. In the case when the shot noise dominates, the SNR can be expressed as $$SNR = m^2 N/8 \qquad (1)$$

where $m = I_s/I_p$ is the contrast, where $I_s$ is the signal power, $I_p$ is the total light power, N is the number of electrons stored in the pixel of the photo-sensor. If SNR is 40 dB and $N=10^5$ then the contrast is m=9%.

Figure 3:
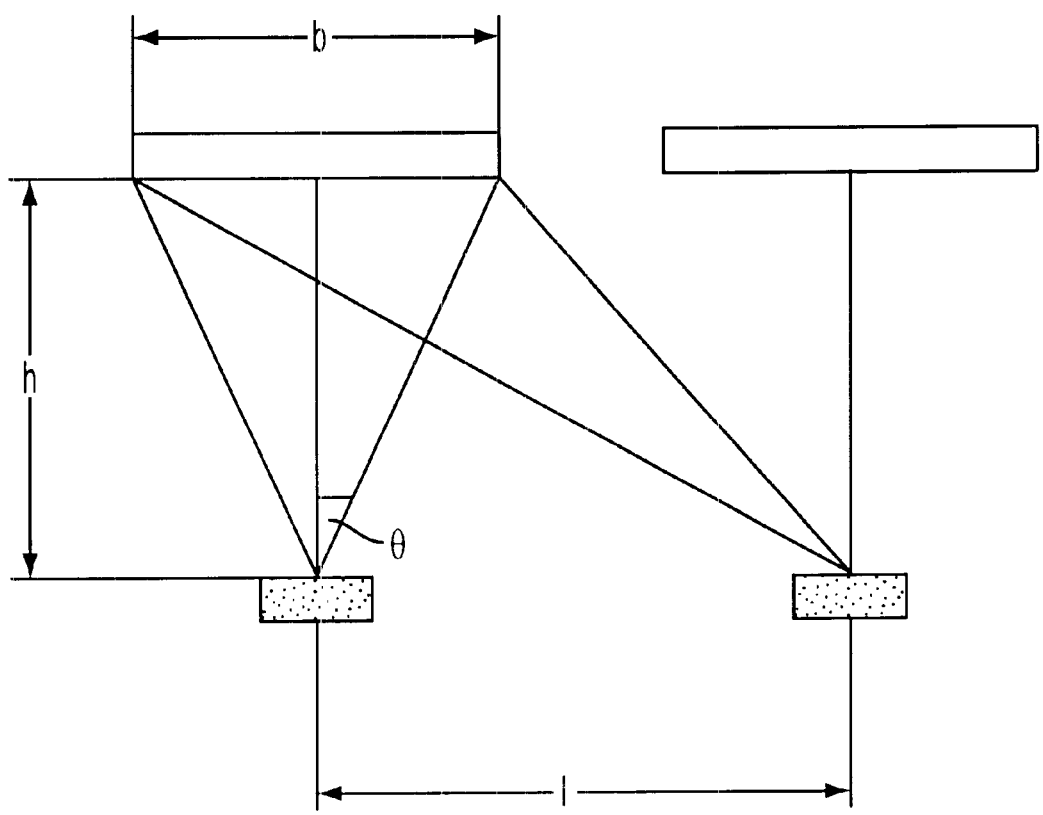
FIG. 3 is an illustration to the estimation of the cross talk between neighbor memory cells during a readout process.

The signal power per pixel is proportional to the spherical angle (see FIG. 3)

$$I_s \sim \sin^2 \theta/2 \qquad (2)$$

where $\sin \theta = b/(b^2+h^2)^{1/2}$, b is the pixel size, h is the distance between the surface of the photo-sensor and the readable layer. The contribution to the total power per pixel from the eight neighbor cells, could be estimated as (see FIG. 3)

$$I_p - I_s \sim 2h^2 b^2 (b^2 + l^2)^{-2} \qquad (3)$$

Estimation (3) is obtained through the assumption of b<<1, where 1 is the distance between the neighbor emitting cells. The contribution of the others cells located at the longer distances is negligible. The comparison of the expressions (2) and (3) shows that the demand for a contrast is satisfied when the thickness is comparable with the distance between the emitting cells h~1. This condition determines the optimal over-sampling rate during the reading of each readable layer. In another words, the maximal data rate for a certain layer depends on its distance from the photosensitive surface. For example, if the CCD matrix has 4000×4000 pixels with the size of 10 $\mu$ and the distance between the readable layer and the photo-sensor surface is 20 $\mu$, the distance between the neighbor emitting cells must be 20 $\mu$, thus an over-sampling is 4. For the frame rate of 25 frame/s it gives the readout data rate of 100 Mb/s. In the general case, the readout data rate as a function of the numeral number of a layer, can be expressed in the following way:

$$R=MR_{fr} \text{ for } h<b$$

$$R\sim MR_{fr}(b/\delta)^2/N^2, \text{ for } h>b$$

where M, is the number of pixels in the photosensitive matrix, $R_{fr}$ is the frame rate, $\delta$ is the thickness of the compound of activating layer and memory layer.

Let us consider a numerical example. The size of the information field is 4×4 cm². The size of the electroluminescence cell is equal to 0.5×0.5 $\mu^2$ and the distance between neighbor cells is also 0.5 $\mu$. Hence the capacity of the layer is C=200 MB. Table 1, demonstrates the readout data rate for several meanings of the numeral number N for the following values of the parameters M=16 Mpxl, b=10 $\mu$, $\delta$=2 $\mu$.

TABLE 1

| Numeral number of layers | Data rate Mb/s |
|---|---|
| 1 | 400 |
| 10 | 100 |
| 20 | 25 |
| 30 | 11 |

The total capacity of the 20 layer device, corresponding to the parameters shown above is 4 GB.

In another numerical example, we can demonstrate a possibility to utilize large size memory cells. Decreasing of the pixel density can be compensated by the application of a gray scale level of the stored charges. The available level of the gray level depends on the total amount of the stored charge. For the size of the pixel of 10 $\mu$ and the gray level scale of 128, the total capacity of 20 layers device is 4 GB. The evident backlash of the increasing of the cell size, is that it leads to an increasing of the charging time; however, the system uses parallel recording with high integral data rate even for comparable long charging time. For example, if the charging time is 1 ms and the capacity of one layer is 200 MB than the recording data rate is 200 GB/s. Note, that the density of the recorded information is not restricted by the diffraction limit as it is in the conventional optical data storage devices and is limited only by the corresponding technology of the fabrication method. Thus, the lateral density could be measured in tens of nanometers. For example, for the cell size of 40 nm and for the distance between neighbor cells of 10 nm the data density is 5 GB/cm². To diminish the undesirable cross talk during the recording, the electroluminescent cells could be equipped with the micro-lens matrix. The photosensitive could be equipped with micro-lenses as well.

Some variations of the embodiment disclosed above will be described.

Figure 4:
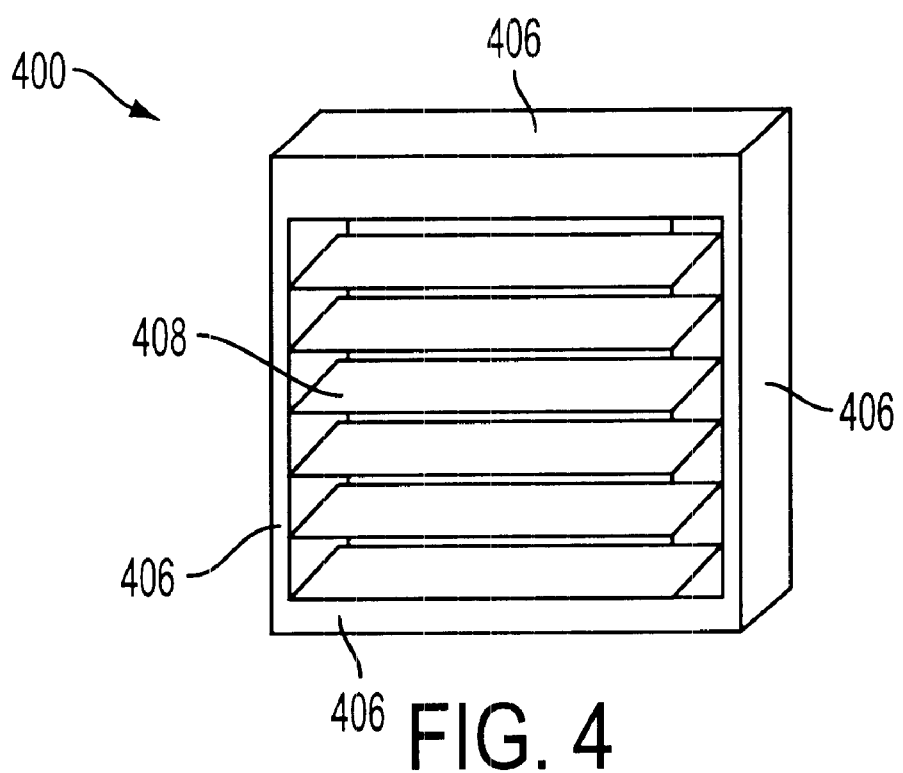
FIG. 4 is a view of the device capable of 3-D encoding volumetric memory.

FIG. 4 shows an assembly 400 for volumetric encoding of a memory. A plurality of memory matrices 408, each constructed as already described, define a plurality of layers. Electroluminescent matrices 406 are provided so as to be oriented in two dimensions. A vertically oriented one of the electroluminescent matrices 406 is actuated in a certain location thereon to select one of the memory matrices 408, while a horizontally oriented one of the electroluminescent matrices 406 is actuated in a certain location thereon to select one of the memory cells in that matrix 408.

Figure 5:
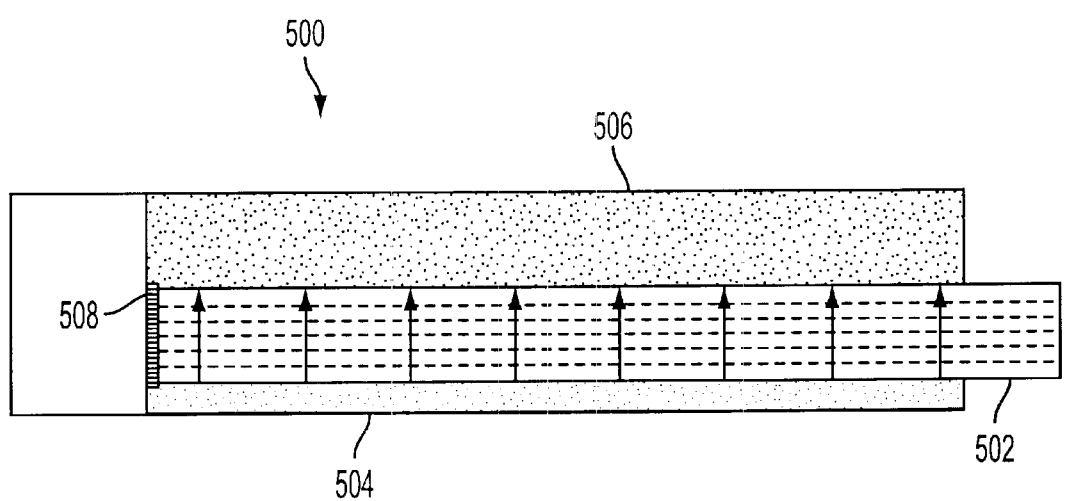
FIG. 5 is a view of the reader that encompasses a removable memory device.

FIG. 5 shows a reader 500 for reading a removable card 502 in which the memory cells are provided. Each layer of memory cells in the card 502 is constructed as described above. The card 502 is provided separately from the reader 500, which has an electroluminescent (e.g., VCSEL) matrix 504 and a camera (e.g., CMOS or CCD) 506. The reader 500 also has terminals 508 for contacting the electrodes in the card 502. Reading and writing are as already described.

Variations of the above embodiment will now be disclosed.

Figure 6:
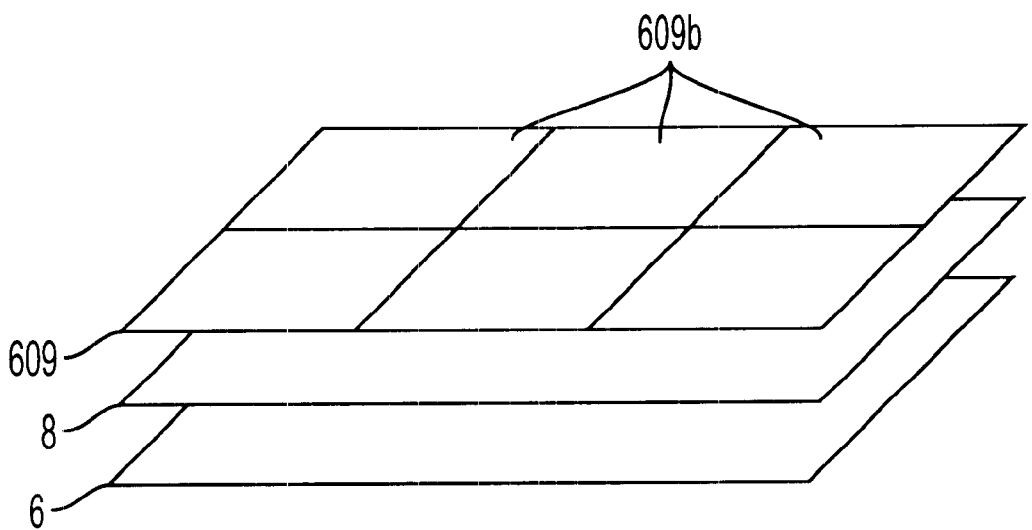
FIGS. 6–14 show variations of the memory device and the reader.

In the memory device of FIG. 6, the photosensitive matrix 609 is divided into sectors 609b so that the memory cells in the matrix 8 can be read out in parallel.

Figure 7:
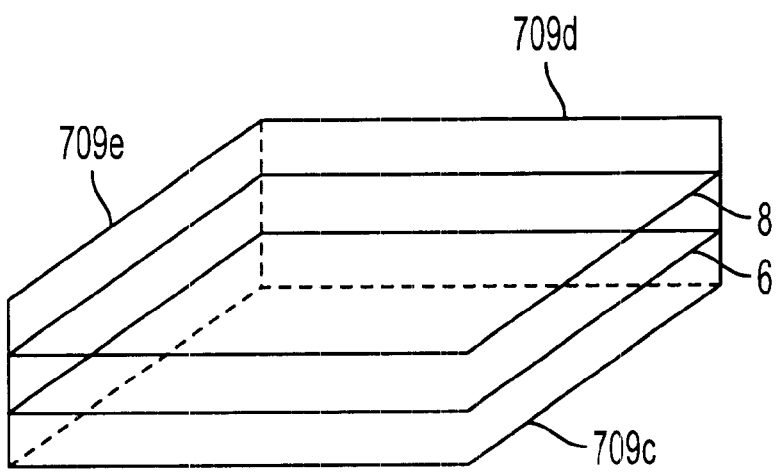

In the memory device of FIG. 7, there are three photosensitive matrices 709c, 709d, 709e arranged to be orthogonal to one another for easy reading of the medium in three dimensions.

Figure 8:
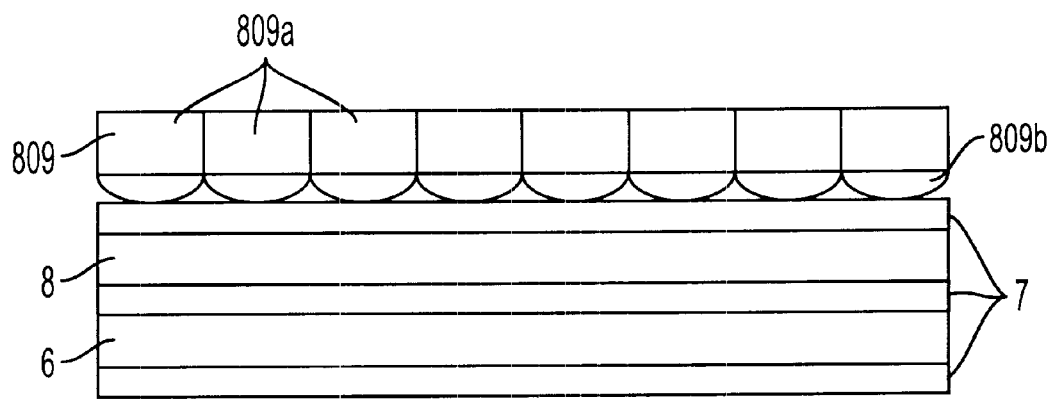

The photosensitive matrix 809 of FIG. 8 has multiple pixels 809a, each with a microlens 809b.

Figure 9:
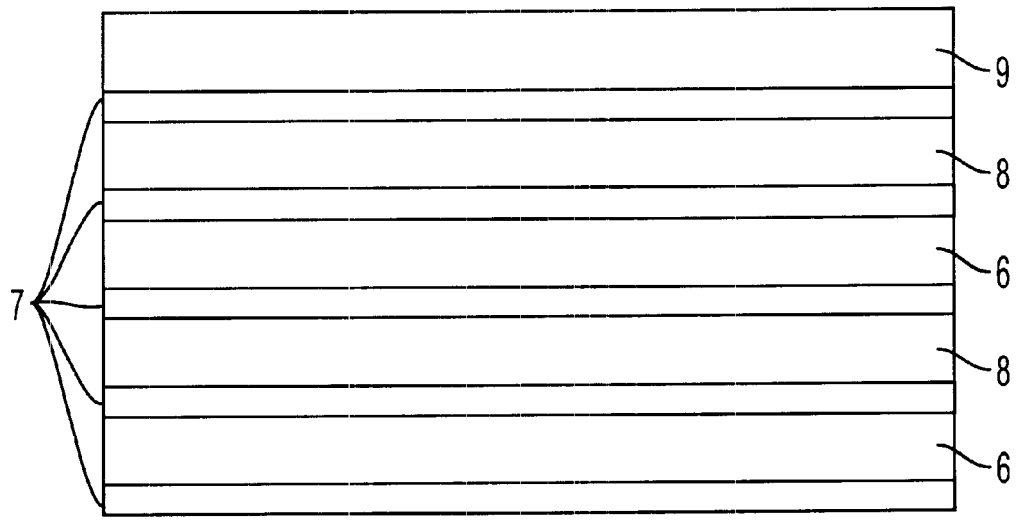

In the memory device of FIG. 9, multiple matrices 6 and 8 are provided in alternation, with electrodes 7 provided between them.

Figure 10:
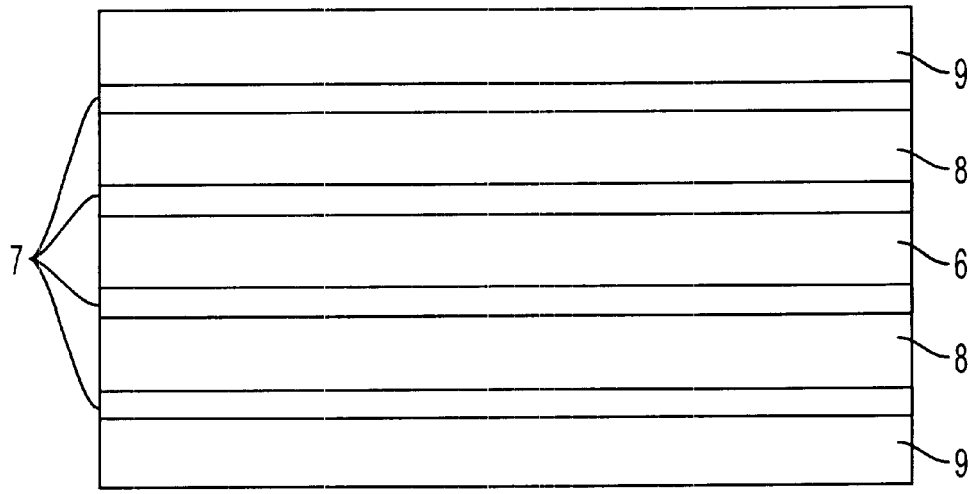

As shown in FIG. 10, the electroluminescent matrix 6 is provided in the middle, with the memory matrices 8 provided on either side. Photosensitive matrices 9 can be provided on one or both sides.

Figure 11:
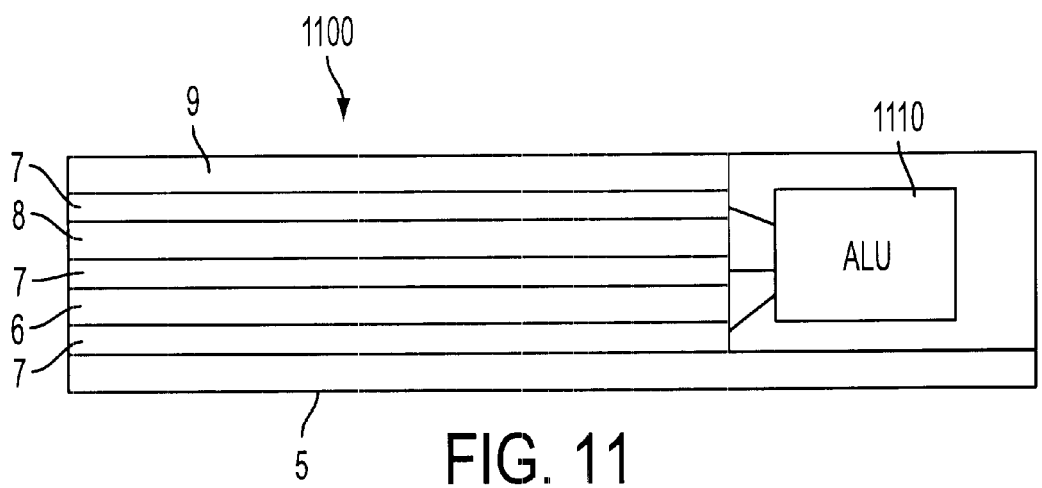

The memory device 1100 of FIG. 11 includes an ALU 1110 or other processing device in communication with the other components.

Figure 12:
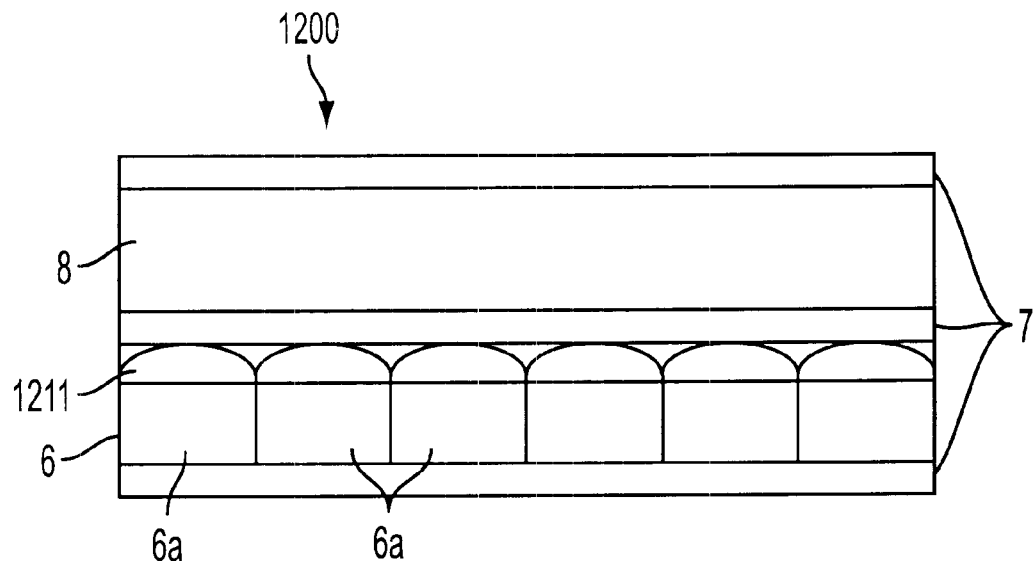

In the memory device 1200 of FIG. 12, each pixel 6a of the electroluminescent matrix 6 is provided with a microlens 11.

Figure 13:
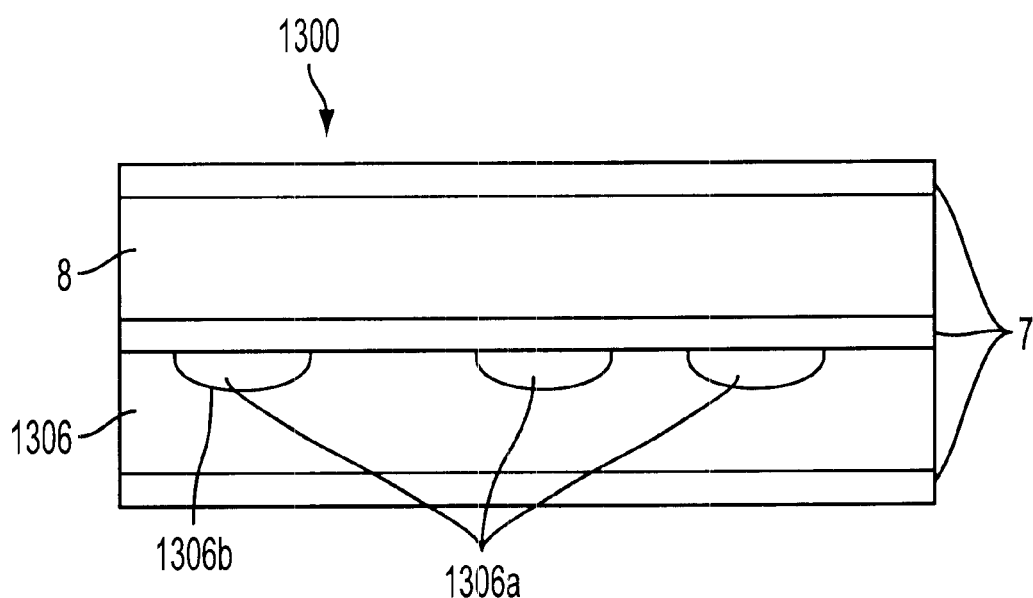

FIG. 13 shows a ROM 1300 constructed according to the principles of the invention. Instead of an electroluminescent matrix 6, the electroluminescent matrix includes a substrate 1306 in which electrolumescent material 1306a is disposed in pits 1306b.

Figure 14:
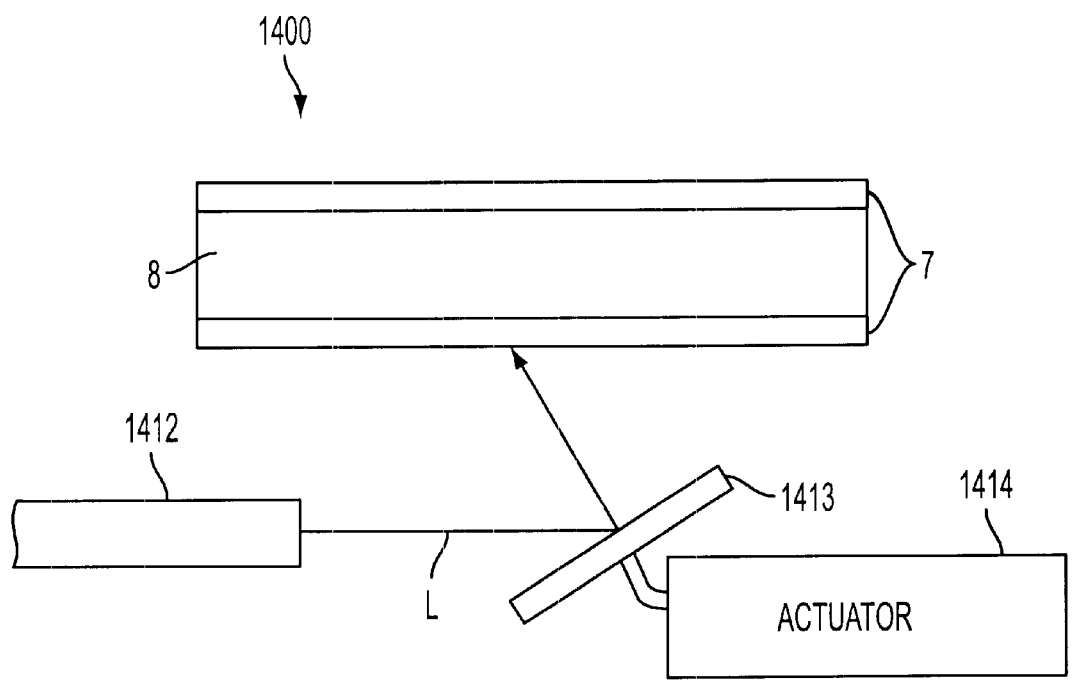

In the device 1400 of FIG. 14, the electroluminescent matrix is replaced with a scanning mirror or other scanning device 1413 under the control of an actuator 1414. Any suitable scanning device 1413 could be used, whether a planar mirror, a rotating polygonal mirror, a holographic scanner, or any other suitable kind. For scanning in two dimensions, one scanning device, or two scanning devices in series, could be used. The scanning device 1413 scans light L from a light source 1412 such as an optical fiber or a planar waveguide across the memory matrix 8.

Variations in the memory cells will now be disclosed.

Figure 15:
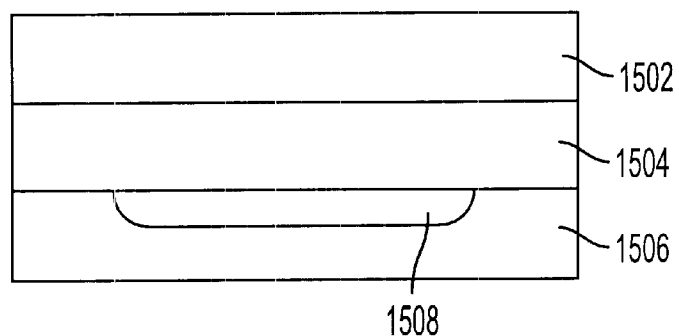
FIGS. 15–17 show variations of the memory cell.

As shown in FIG. 15, the memory cell is implemented as a CIS device, as explained above and in the above-cited '026 patent. The memory cell includes a conductor layer 1502, an insulator layer 1504, and a semiconductor layer 1506. In use, a depletion region 1508 forms in the semiconductor layer 1506.

Figure 16:
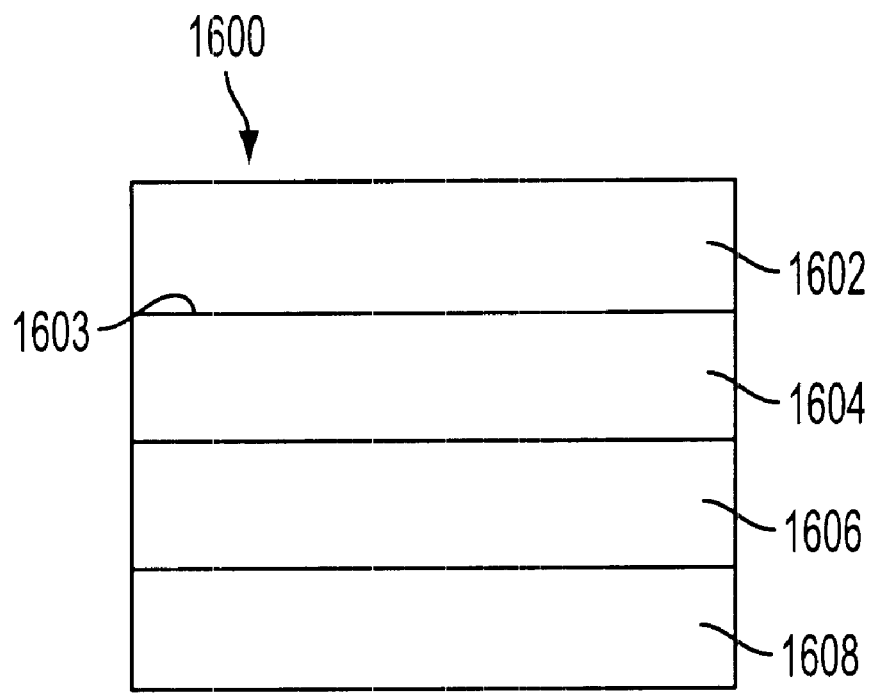

The memory cell 1600 of FIG. 16 includes oppositely doped semiconductor layers 1604, 1604 to define a p/n junction 1603. A trapping layer 1608 is provided to trap carriers permanently to provide a WORM medium. An optional second trapping layer 1606 can serve as an erasable trap.

Figure 17:
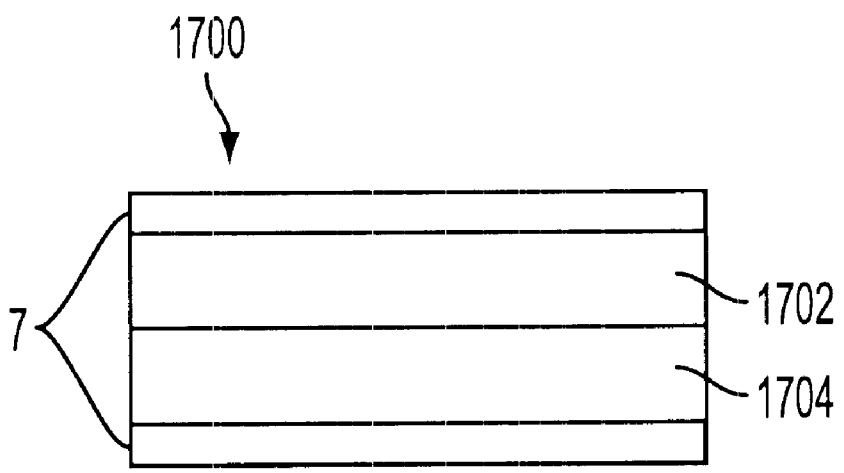

The memory cell 1700 of FIG. 17 includes a chargeable sub-cell 1702 and an electroluminescent sub-cell 1704. The electroluminescent sub-cell 1704, during reading, either does or does not emit light, in accordance with a charge state of the chargeable sub-cell 1702.

While various preferred embodiments have been set forth above, those skilled in the art who have reviewed the present disclosure will readily appreciate that other embodiments can be realized within the scope of the invention. For example, numerical values are illustrative rather than limiting, as are recitations of specific materials. Also, wherever possible, any variations disclosed separately could be combined, while any variations disclosed together could be implemented separately. Therefore, the present invention should be construed as limited only by the appended claims.

What we claim is:

1. A memory device comprising:
    an electroluminescent matrix comprising a plurality of individually electrically addressable electroluminescent cells;
    a plurality of memory cells, one or more of said plurality of memory cells being stacked on each of the plurality of electroluminescent cells; and
    a plurality of light-transparent electrodes for individually electrically addressing the plurality of electroluminescent cells by applying a biased voltage and for addresssing the one or more memory cells stacked on each of the plurality of electroluminescent cells.

2. The memory device of claim 1, further comprising an insulating substrate on which the electroluminescent matrix is disposed.

3. The memory device of claim 1, wherein each of the electroluminescent cells comprises a light-emitting diode.

4. The memory device of claim 3, wherein the light-emitting diode comprises a non-organic semiconductor material.

5. The memory device of claim 3, wherein the light-emitting diode comprises an organic polymer semiconductor.

6. The memory device of claim 1, wherein the plurality of light-transparent electrodes comprise column lines and row lines crossing perpendicularly to each other to define cross points, one of the electroluminescent cells being located at each of the cross points.

7. The memory device of claim 1, wherein each electroluminescent cell is stacked with several of the memory cells.

8. The memory device of claim 1, wherein each of the electroluminescent cells comprises a vertical laser.

9. The memory device of claim 1, wherein each of the electroluminescent cells comprises a VCSEL.

10. The memory device of claim 1, wherein each of the memory cells comprises a conductor-insulator-semiconductor (CIS) device with a vertically stacked structure.

11. The memory device of claim 1, wherein each of the light-transparent electrodes comprises ITO.

12. The memory device of claim 1, wherein each of the light-transparent electrodes comprises AZO.

13. The memory device of claim 1, further comprising a photosensitive matrix for reading out information from the memory cells.

14. The memory device of claim 13, wherein the photosensitive matrix comprises a CCD matrix.

15. The memory device of claim 13, wherein the photosensitive matrix comprises a CMOS matrix.

16. The memory device of claim 13, wherein the photosensitive matrix comprises a plurality of pixels, each of the pixels being at least as large as a corresponding one of the memory cells.

17. The memory device of claim 13, wherein the photosensitive matrix comprises a plurality of sectors for reading the information in parallel.

18. The memory device of claim 13, wherein the information is recorded in three perpendicular planes, and wherein the photosensitive matrix comprises three sectors, each parallel to one of the planes.

19. The memory device of claim 13, wherein the photosensitive matrix comprises a plurality of pixels, each with a micro-lens.

20. The memory device of claim 1, comprising a periodical structure which comprises a plurality of said electroluminescent matrices alternating with a plurality of layers of said memory cells.

21. The memory device of claim 20, further comprising a photosensitive matrix.

22. The memory device of claim 21, wherein the photosensitive matrix comprises a CCD matrix.

23. The memory device of claim 21, wherein the photosensitive matrix comprises a CMOS matrix.

24. The memory device of claim 1, wherein each of the memory cells is capable of coupling a charge under illuminating light emitted by a corresponding one of the electroluminescent cells while under biased voltage supplied by the light transparent electrodes.

25. The memory device of claim 24, wherein each of the memory cells is capable of maintaining the coupled charge after switching off of an external power supply.

26. The memory device of claim 25, wherein each of the memory cells is capable of emitting light due to reversing of the biased voltage.

27. The memory device of claim 24, wherein each of the memory cells utilizes tunneling of minority carriers to a trapping layer structure assisted by light absorption.

28. The memory device of claim 24, wherein each of the memory cells comprises a p/n junction and a trapping layer and utilizes light absorption assisted electron-hole generation at the p/n junction under the reversing biased voltage to couple the charge in the trapping layer.

29. The memory device of claim 28, wherein the trapping layer serves as a non-erasable trap for the charge.

30. The memory device of claim 29, further comprising a second trapping layer that serves as an erasable trap.

31. The memory device of claim 1, wherein each of the memory cells comprises a chargeable sub-cell and an electroluminescent sub-cell, and wherein during reading of the memory device, the electroluminescent sub-cell emits or does not emit light depending on a status of the chargeable sub-cell.

32. The memory device of claim 1, wherein the electroluminescent matrix comprises optically transparent material and defines two sides, and wherein the memory cells are stacked on both of the sides of the electroluminescent matrix.

33. The memory device of claim 32, further comprising a photosensitive matrix facing one of the sides of the electroluminescent matrix.

34. The memory device of claim 33, further comprising a second photosensitive matrix facing the other side of the electroluminescent matrix.

35. The memory device of claim 1, wherein each electroluminescent cell is larger than a corresponding one of the memory cells.

36. The memory device of claim 35, wherein adjacent ones of the memory cells are spaced apart by a distance greater than a size of the electroluminescent cells.

37. The memory device of claim 1, wherein each of the memory cells stores information in a multi-bit format by storing one of a plurality of charge levels.

38. The memory device of claim 1, wherein the memory device implements at least one type of memory selected from the group consisting of read/write (R/W), write once read many (WORM), dynamic random access memory (DRAM), static random access memory (SDRAM), and programmable read only memory (PROM).

39. The memory device of claim 38, wherein the memory device implements a plurality of types of memory selected from said group.

40. The memory device of claim 38, further comprising a processing unit.

41. The memory device of claim 40, wherein the processing unit comprises an arithmetic and logic unit (ALU).

42. The memory device of claim 1, further comprising a plurality of micro-lenses, each covering one of the electroluminescent cells.

43. The memory device of claim 1, wherein information is recorded in the electroluminescent cells such that the memory device functions as a ROM device.

44. The memory device of claim 43, wherein the electroluminescent matrix comprises a substrate with pits in which the electroluminescent cells are formed.

45. The memory device of claim 1, wherein each of the memory cells comprises an electrochromic material having a transparency which changes under the biased voltage.

46. The memory device of claim 45, wherein, when the biased voltage is turned off, the electrochromic material is transparent.

47. The memory device of claim 46, wherein the transparency of the electrochromic material changes irreversibly.

48. The memory device of claim 45, wherein the transparency of the electrochromic material changes in a manner which is persistent when the biased voltage is turned off.

49. The memory device of claim 45, further comprising a matrix of pits filled with the electrochromic material.

50. The memory device of claim 1, wherein a size of the memory cells and a distance between adjacent ones of the memory cells are smaller than a corresponding size and the distance determined from a diffraction limit.

51. A method of storing information, the method comprising:
(a) providing a memory device comprising:
an electroluminescent matrix comprising a plurality of individually electrically addressable electroluminescent cells, the electroluminescent cells having a size;
a plurality of memory cells, one or more of said plurality of memory cells being stacked on each of the plurality of electroluminescent cells; and
a plurality of light-transparent electrodes for individually electrically addressing the plurality of electroluminescent cells by applying a biased voltage and for addressing the one or more memory cells stacked on each of the plurality of electroluminescent cells; and
(b) writing the information into the memory device by addressing the memory cells in such a way that a minimum distance between simultaneously addressed ones of the memory cells is greater than the size of the electroluminescent cells.

* * * * *